United States Patent
Cracauer et al.

(10) Patent No.: US 6,981,445 B2
(45) Date of Patent: Jan. 3, 2006

(54) METHOD AND APPARATUS FOR MICRO-CONTACT PRINTING

(75) Inventors: Raymond Francis Cracauer, Middleton, WI (US); Rocky Ganske, Oakville (CA); M. Cynthia Goh, Toronto (CA); Jane B. Goh, Toronto (CA); Adam Brian Liederman, Toronto (CA); Richard Loo, Toronto (CA); Pui Tam, Toronto (CA)

(73) Assignee: Axela Biosensors Inc., Toronto (CA)

( * ) Notice: Subject to any disclaimer, the term of this patent is extended or adjusted under 35 U.S.C. 154(b) by 0 days.

(21) Appl. No.: 10/744,949

(22) Filed: Dec. 24, 2003

(65) Prior Publication Data
US 2005/0139103 A1 Jun. 30, 2005

(51) Int. Cl.
*B41K 3/02* (2006.01)
(52) U.S. Cl. ............ 101/368; 101/327; 435/287.1
(58) Field of Classification Search ............ 101/327, 101/333, 109, 368, 491, 493; 435/6, 7.1, 435/287.1, 287.2
See application file for complete search history.

(56) References Cited

U.S. PATENT DOCUMENTS

| | | | |
|---|---|---|---|
| 3,756,165 A | 9/1973 | Valiela | |
| 4,098,184 A | 7/1978 | Okada et al. | |
| 5,512,131 A | 4/1996 | Kumar et al. | |
| 5,669,303 A | 9/1997 | Maracas et al. | |
| 5,937,758 A * | 8/1999 | Maracas et al. | ............ 101/327 |
| 5,947,027 A | 9/1999 | Burgin et al. | |
| 6,013,446 A * | 1/2000 | Maracas et al. | ............... 435/6 |
| 6,180,239 B1 | 1/2001 | Whitesides | |
| 2001/0004526 A1* | 6/2001 | Everhart et al. | ............... 435/6 |
| 2002/0050220 A1* | 5/2002 | Schueller et al. | ........... 101/486 |
| 2002/0130444 A1 | 9/2002 | Hougham | |
| 2003/0047535 A1 | 3/2003 | Schueller et al. | |
| 2003/0178316 A1 | 9/2003 | Jacobs et al. | |
| 2003/0213382 A1 | 11/2003 | Kendale et al. | |

* cited by examiner

*Primary Examiner*—Leslie J. Evanisko
(74) *Attorney, Agent, or Firm*—Lynn C. Schumacher; Hill & Schumacher

(57) ABSTRACT

An apparatus for producing patterns on a surface of a substrate. The apparatus includes a rigid support such as a rigid tubular structure having first and second opposed ends and a fluid flow passageway extending therethrough. A printing stamp is attached at one of the opposed ends of the rigid support. The printing stamp has a flexible diaphragm portion which has an outer surface which is coated with one or more materials in a pre-selected pattern. A pneumatic pressurizing mechanism communicating with an inner surface of the flexible diaphragm portion through the fluid flow passageway is used to bias the flexible diaphragm portion outwardly into intimate and uniform contact with the surface of the substrate for transferring the pre-selected pattern onto the substrate surface. The rigid tubular supports are attached to a robotic positioning mechanism for providing control of positioning of the stamp relative to the substrate surface.

18 Claims, 4 Drawing Sheets

METHOD AND APPARATUS FOR MICRO-CONTACT PRINTING

FIELD OF THE INVENTION

The present invention relates to a method and apparatus for the production of micro patterns on various substrates.

BACKGROUND OF THE INVENTION

Microcontact printing is a technique of patterning structures on a surface by using an elastomeric stamp with relief patterns. The stamp is inked with the material to be patterned then put in contact with the surface and transfer of the ink only occurs in the areas of the relief that come in contact with the surface.

Current methods of micro-contact printing pose several challenges. One primary difficulty is the need to achieve reliable contact between the stamp surface pattern elements and the substrate. As the "ink" being transferred is essentially a molecular monolayer, it is essential that the stamp (typically made from a polymer such as polydimethylsiloxane (PDMS)) come into intimate contact with the substrate. This can be accomplished in a number of ways. The stamp surface may be taken to a nominal position which is slightly past the substrate thus ensuring that despite the inevitable imprecision of the locations of the stamp surface and the substrate, intimate contact is achieved. However, this method has the disadvantage of either requiring very accurate positional control or of compressing the stamp and thereby creating pattern distortions of unacceptable magnitude including the possibility of establishing contact between the substrate and areas of the stamp between the raised features. As feature size is on the order of 5 microns one can appreciate the difficulty involved.

A more sophisticated approach to the problem controls, or measures and controls, the contact force as the stamp touches the substrate. A number of methods can be employed to achieve this control. A spring or similar device may be inserted into the motion control mechanism to establish an essentially uniform contact force over a sufficiently wide range of linear displacement. Alternatively a pneumatic or hydraulic coupling may be used to the same end or a direct force measurement may be used as feedback to control the motive device.

These methods mitigate the contact issue in that they decrease the required precision of the motion control. However, there are several drawbacks. A simple scheme of spring loading may result in variations in contact force due to friction or variation in mechanical components. Determination of the proper force may be a protracted process as well, requiring careful adjustments of pretension in the spring or replacement of spring elements.

The use of a pneumatic or hydraulic coupling eases the required adjustments, but still presents problems of friction and control. Force feedback to the motion control device allows rapid, controllable adjustment that may essentially compensate for mechanical variations, but adds considerably to the cost of a patterning system. Most importantly, while all these approaches will compensate for errors of position in an axis perpendicular to the planes of the stamp and substrate, none of them provide for angular deviations. If the stamp initially contacts the substrate in a non-parallel manner, continued application of contact force will result in locally greater stamp compression in the area of first contact. If enough force is applied to ensure intimate contact of the entire patterned area, excessive compression of the stamp elements in this initial contact area and subsequent distortion of the pattern may result.

Given careful engineering, design and fabrication of motion control devices, stamps and substrates, and selection of high precision components, many of the problems noted above may be avoided or mitigated. However, achieving this level of precision is expensive and may result in a system that requires a high level of maintenance. For many applications, these conditions may be acceptable, but for circumstances of high volume production or especially if multi-site production is required, a lower cost, more robust method is desirable.

SUMMARY OF THE INVENTION

The present invention provides a micro-contact printing apparatus for producing micro patterns on a surface of a substrate, comprising:

a rigid support member having first and second opposed ends and a fluid flow passageway extending therethrough;

a printing stamp having a portion defining a flexible diaphragm portion, the flexible diaphragm portion having an outer surface which is coated with one or more materials in a pre-selected pattern;

biasing means communicating with an inner surface of the flexible diaphragm portion through the fluid flow passageway for biasing the flexible diaphragm portion outwardly into intimate and substantially uniform contact with the surface of the substrate for transferring the pre-selected pattern of the one or more materials onto the surface; and a position mechanism, the rigid support member being constructed and configured to allow oriented attachment to said positioning mechanism, said printing stamp being integrally formed with the first of the opposed ends of the rigid support member in such a manner that, after the rigid support member is engaged by the positioning mechanism so that the flexible diaphragm portion is moved into close position relative to the surface of the substrate prior to pattern transfer and the flexible diaphragm portion thereafter biased, the flexible diaphragm portion is not excessively stretched during pattern transfer to give a substantially undistorted micro pattern on the surface of the substrate.

BRIEF DESCRIPTION OF THE DRAWINGS

The following is a description, by way of example only, of a method and apparatus for micro-contact printing in accordance with the present invention, reference being had to the accompanying drawings, in which.

DETAILED DESCRIPTION OF THE INVENTION

Figure 1:
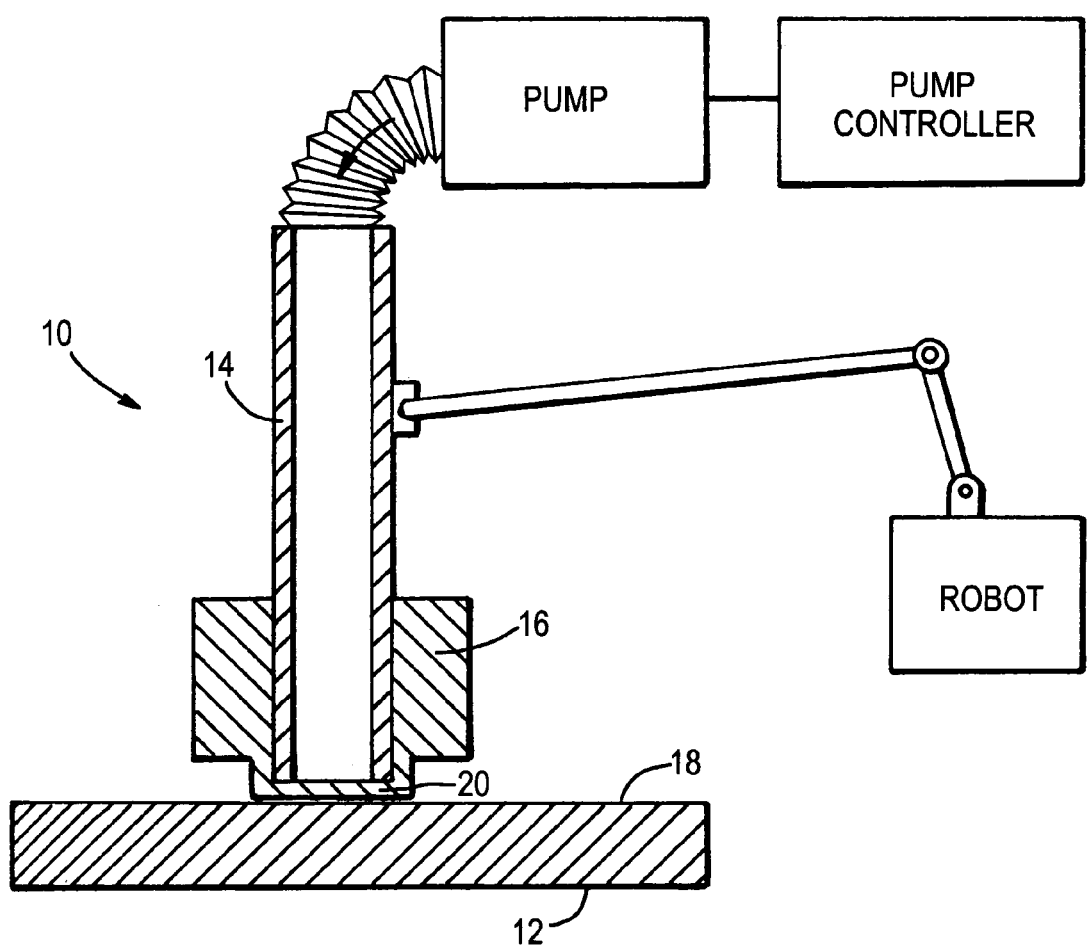
FIG. 1 is a sectional view of a micro-contact printing stamp constructed in accordance with the present invention.
Figure 1A:
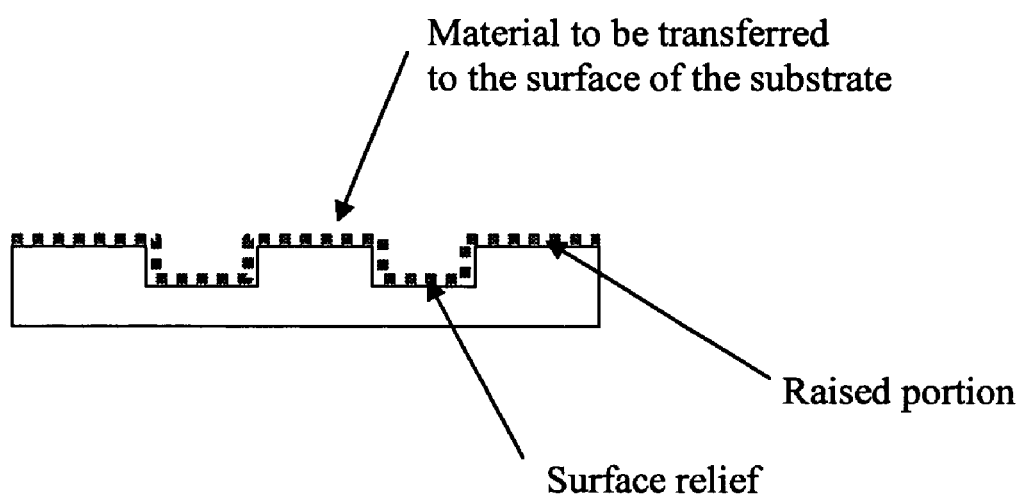
FIG. 1a is a view of showing the relief pattern including a raised portion.

The present invention allows for highly uniform contact between a stamp containing surface pattern elements and substrate while requiring only relatively coarse positioning of the stamp and substrate. FIG. 1 is a sectional view of a stamp integral with a support and alignment structure shown generally at 10 engaging a substrate 12 to be printed with a pattern. Stamp 10 includes a rigid structural support and alignment member 14, the cylindrical tubular member shown in FIG. 1 is a preferred embodiment but it will be appreciated that the member 14 need not be a cylindrical tube per se. Located over one end of tubular member 14 is a polydimethylsiloxane (PDMS) micro-contact printing stamp 16 used to transfer the pattern to the top surface 18 of substrate 12.

The PDMS micro-contact printing stamp 16 includes a diaphragm portion 20 which fits over the end of tubular member 14 which is thin enough to be able to undergo displacement in the vertical direction. Typical dimensions of the stamp may include the diaphragm portion 20 having a thickness of about 0.2 mm, and a diaphragm diameter of approximately 2 mm. It will be appreciated that these dimensions are in no way limiting and may be varied depending on the applications and material of which the molding stamp 16 is made, with the PDMS shown in FIG. 1 being exemplary only. For example, other materials that may be used to make the stamps include other silicone polymers, epoxy polymers, acrylate polymers, polyolefins, other elastomeric polymers such as butyl or nitrile rubbers. The polymeric material may be either a natural rubber or a synthetic rubber.

Table I below provides a non-limiting list of elastomeric polymers from which the printing stamp may be made with common names and abbreviations. The materials listed in Table I are exemplary only and is not an exhaustive list.

TABLE I

| Chemical Name | Common Name | Abbreviation |
| --- | --- | --- |
| 1a Isoprene, Natural | Natural Rubber | NR |
| 1b Isoprene, Synthetic | Polyisoprene | IR |
| 2 Styrene Butadiene Copolymer | SBR | SBR |
| 3 Terpolymer of Ethylene, Propylene and a diene | EPDM | EPDM |
| 4 Isobutene Isoprene Polymer | Butyl | HR |
| 5 Chloroprene | Neoprene | CR |
| 6 Acrylonitrile - Butadiene Copolymer | Nitrile | NBR |
| 7 Chlorosulphonated Polyethylene | Hypalon | CSM |
| 8 Polysiloxanes | Silicone Rubber | "Q" Group |
| 9 Polyesters | Polyurethane | AU |
| 10 Fluorinated Hydrocarbon | Viton | FPM |

In one embodiment, the stamps may be made by casting an elastomeric polymer on a master made of a hard material, such as silicon or acrylic which has relief structures. The polymer is heat cured then separated from the master to produce the stamp that has negative relief of the master. Thus, the stamp is patterned to give it a pre-selected surface relief pattern and then it is coated uniformly with the material. The stamp is then inked by dipping into swabbing with, or putting a drop of the solution containing, the material to be patterned. The stamp, which may or may not be rinsed, is dried with a stream of gas then put in contact with the substrate surface to effect the transfer of the material in a pattern.

Those skilled in the art will appreciate that other ways may be used to produce a pattern on the stamp. For example, in another embodiment of the stamp one may use a flat stamp which has the materials placed there in a pattern through a different inking process by using a stamp pad with a pattern on it. The material (or "ink") to transferred could be almost any material and may include small molecules, polymers, biomaterials, particles, protein, DNA, RNA etc.

Figures 2A, 2B:
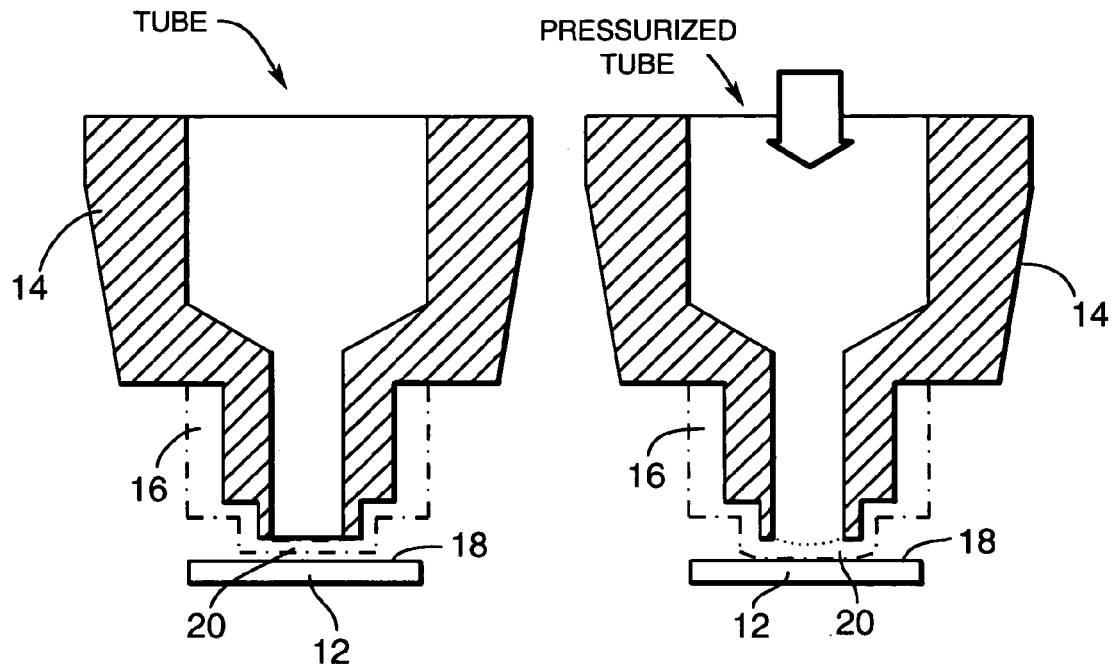
FIG. 2a is a cross sectional view of the polymer stamp mounted on the end of a housing in the unpressurized position.
FIG. 2b is a cross sectional view of the polymer stamp mounted on the end of a housing with the interior of the housing pressurized.

Thus the pre-selected or desired pattern elements are contained on the outer surface of the thin diaphragm section 20 of PDMS molding stamp 16. The molding is formed integrally with a structure constructed to allow oriented attachment to a suitable means of motion control and pneumatic pressure. The flexible diaphragm portion 20 is suitably thin to allow ready displacement by, for example, pneumatic pressure applied to the opposite end of the tubular member 14. When the stamp 16 is positioned as shown in FIG. 1 or 2a with the diaphragm portion 20 located adjacent and near the surface 18 of the substrate 12, application of gas pressure through the channel 22 in tubular member 14 to diaphragm portion 20 will displace the diaphragm outwardly toward the surface and bring it into contact with surface 18 of the substrate 12 as shown in FIG. 2b.

Figure 3:
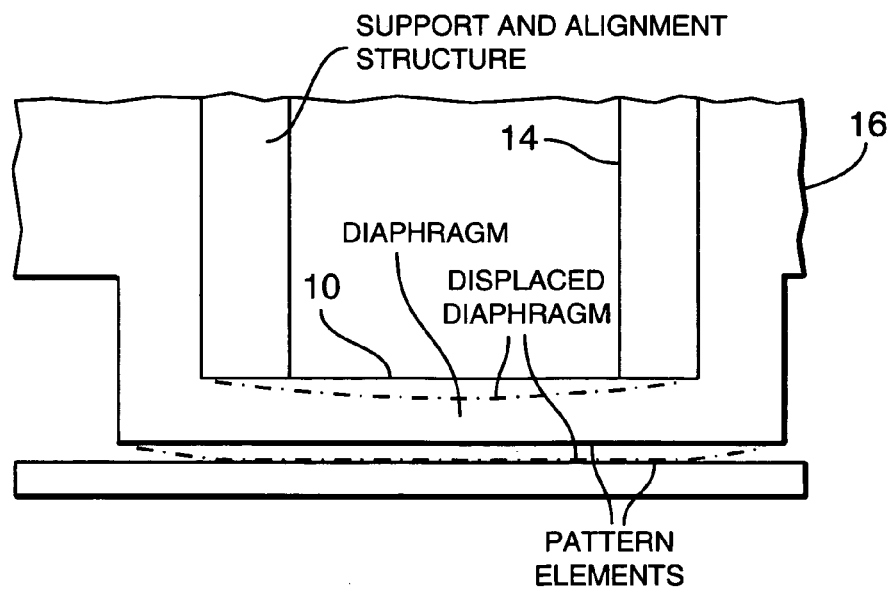
FIG. 3 is an enlarged view of a portion of FIG. 2b showing the location of the diaphragm portion of the micro-contact printing stamp in both relaxed and distended positions.
Figure 4:
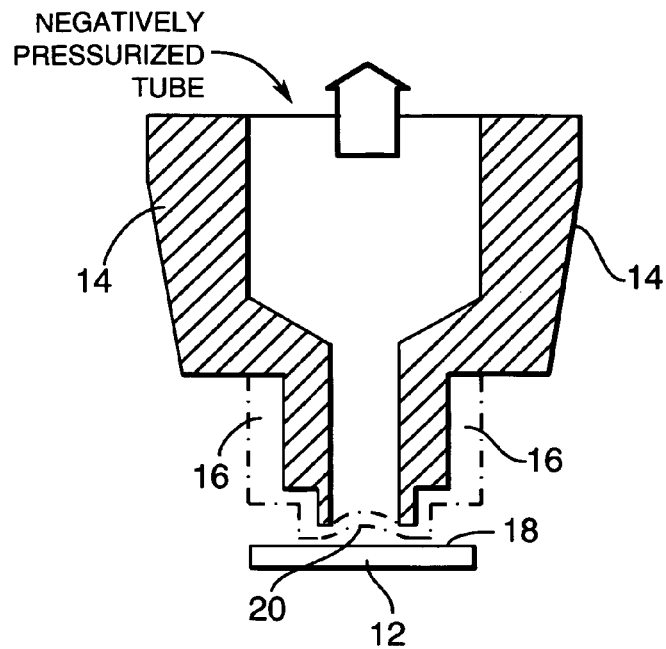
FIG. 4 is a cross sectional view of a polymer stamp mounted on the end of a housing with the interior of the housing having a negative pressurize thereby drawing the end portion of the stamp into the interior of the housing.
Figure 5:
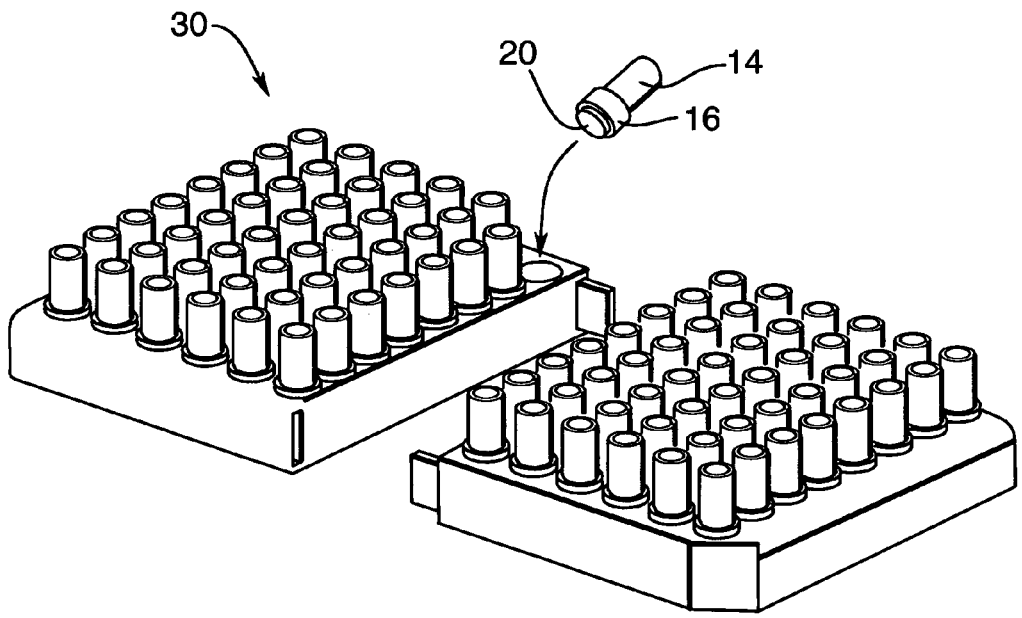
FIG. 5 shows an array of stamp assemblies suitable for use with standard or modified laboratory robotic fluid handling devices.

FIG. 3 is an enlarged detail of the outwardly biased diaphragm 20 in contact with the substrate surface 18. The thin film portion 20 should be brought into close proximity (~0.001") of the surface of the substrate. A positive pressure of approximately 60 psi can be applied inside the tube 14 which will cause the thin polymer film portion 20 to expand like a balloon. This ballooning effect will allow the patterned/inked surface 20 of the thin polymer film to close in the gap between its un-inflated position and the surface of the substrate. The flexible thin film portion 20 will come into intimate contact with the surface 18 of the substrate 12 thereby depositing the pattern of analyte-specific receptors onto the surface of the substrate. By bringing the film portion 20 very close to the surface 18 of the surface 12 prior to pattern transfer it does not need to stretch very much to come into contact with the substrate so that the pattern does not become distorted. Thus, once contact is achieved, the force exerted by the diaphragm portion 20 on the substrate surface 18 is essentially uniform across the entire contact region. Both linear and angular displacements can be accommodated in this way. Some distortion of the pattern results from this process, but if the gap between the diaphragm and substrate is small relative to the diameter of the diaphragm portion 20, this distortion is small and therefore is acceptable for many applications and relatively predictable. Once the stamping process is complete, the pressure may either be released or, a negative pressure may be applied inside the tube in order to separate the thin film portion 20 from the surface 18 of the substrate 12 as shown in FIG. 4.

It will be understood by those skilled in the art that the dimensions and pressures mentioned above are simply for illustration and are not meant to be interpreted as limiting conditions. Contact forces considerably lower or higher than 60 psi and the initial proximity may be used. For example, a preferred non-limiting range of initial proximity of the stamp from the substrate may be from about 0.0005" to about 0.005" and a preferred but non-limiting pressure range from 5 psi to at least 100 psi may be used.

The patterns that are produced using the present stamping apparatus may be regular equi-spaced parallel lines or they may be more complicated patterns as discussed in copending U.S. patent application Ser. Nos. 09/814,161 and 10/242,778, both of which are incorporated by reference herein in their entirety.

The present micro-contact printing stamp 10 provides the advantages of not requiring extremely tight dimensional and positional control and of providing a readily controlled, repeatable and even contact force on the elements of the pattern. The rotational orientation of the stamp surface pattern elements with respect to the substrate may be aided using key reference features or by other methods that will be obvious to those skilled in the art. Both angular and axial distance tolerances can be relaxed enough to allow use of readily available motion control devices including standard laboratory robotic fluid handling devices such as the Tecan Genesis RSP or the Beckman FX Laboratory Workstation. This in turn allows a low cost system to be readily constructed either from off the shelf components or by design and fabrication of relatively inexpensive custom equipment.

It will be appreciated by those skilled in the art that a more sophisticated design of the diaphragm 20 and support structure 14 can minimize or eliminate even small distortions in the pattern. For example, reduction of the diaphragm thickness in the perimeter areas outside the patterned area will reduce the distortion in the patterned area as the perimeter areas will distend to a larger extent to accommodate the required displacement. Alternatively, the patterned area can be thickened to achieve the same end. Incorporation of a rolling diaphragm design, similar to that employed by the Marsh-Bellofram Corporation could essentially eliminate any distortion of the patterned area.

An additional advantage of the present invention is the ease of adapting to a low cost disposable device. The PDMS stamp 16 with integral diaphragm 20 may be insert molded around the support 14 using known techniques. This assembly is possible because the tolerances required for position may be relaxed. Referring to FIG. 3 an array of stamp assemblies 30 comprised of the rigid support structure 14 and the resilient flexible stamp 16 suitable for use with standard or modified laboratory robotic fluid handling devices may be used.

The support structure 14 is preferably injection molded of any number of polymers with suitable properties although it will be understood that other materials, such as metals, could also be used.

The present pattern deposition system (PDS) advantageously provides a standardized method for pattern deposition on the surface of a substrate. It provides minimal nominal variation in significant deposition pressure, thermal, humidity, movement rates, stamping sequence, and positional parameters. It provides an easily transportable device.

As used herein, the terms "comprises", "comprising", "including" and "includes" are to be construed as being inclusive and open ended, and not exclusive. Specifically, when used in this specification including claims, the terms "comprises", "comprising", "including" and "includes" and variations thereof mean the specified features, steps or components are included. These terms are not to be interpreted to exclude the presence of other features, steps or components.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

Therefore what is claimed is:

1. A micro-contact printing apparatus for producing micro patterns on a surface of a substrate, comprising:
   a rigid support member having first and second opposed ends and a fluid flow passageway extending therethrough;
   a printing stamp having a portion defining a flexible diaphragm portion, the flexible diaphragm portion having an outer surface which is coated with one or more materials in a pre-selected pattern;
   biasing means communicating with an inner surface of the flexible diaphragm portion through the fluid flow passageway for biasing the flexible diaphragm portion outwardly into intimate and substantially uniform contact with the surface of the substrate for transferring the pre-selected pattern of the one or more materials onto the surface; and
   a positioning mechanism, the rigid support member being constructed and configured to allow oriented attachment to said positioning mechanism, said printing stamp being integrally formed with the first of the opposed ends of the rigid support member in such a manner that, after the rigid support member is engaged by the positioning mechanism so that the flexible diaphragm portion is moved into close position relative to the surface of the substrate prior to pattern transfer and the flexible diaphragm portion thereafter biased, the flexible diaphragm portion is not excessively stretched during pattern transfer to give a substantially undistorted micro pattern on the surface of the substrate.

2. The apparatus according to claim 1 wherein the outer surface which is coated with one or more materials in a pre-selected pattern includes a pre-selected surface relief pattern which is coated substantially uniformly with the material to be transferred to the surface of the substrate.

3. The apparatus according to claim 2 wherein the pre-selected surface relief pattern is defined by a raised portion which is coated substantially uniformly with the material to be transferred to the surface of the substrate.

4. The apparatus according to claim 1 wherein the outer surface which is coated with one or more materials in a pre-selected pattern is substantially planar, and wherein the material to be transferred to the surface of the substrate is applied to the planar surface in the pre-selected pattern.

5. The apparatus for producing patterns according to claim 1 wherein the biasing means includes a pump connected to the second of the opposed ends of the rigid support member for pressurizing the fluid flow passageway with a pressurizing fluid thereby biasing the flexible diaphragm portion outwardly.

6. The apparatus according to claim 5 wherein the pump is operable to pump fluid out of the fluid passageway for applying a negative pressure to an interior of the fluid flow passageway thereby biasing the flexible diaphragm portion inwardly into the passageway for removing it from the surface of the substrate.

7. The apparatus according to claim 6 wherein the pressurizing fluid is a gas.

8. The apparatus according to claim 5 wherein the pump includes a controller for applying pressure pulses to the flexible diaphragm portion for rapidly biasing the flexible diaphragm portion during batch stamping of substrates.

9. The apparatus according to claim 1 wherein the printing stamp is made of a polymeric material.

10. The apparatus according to claim 9 wherein the polymeric material is a natural rubber.

11. The apparatus according to claim 9 wherein the polymeric material is a synthetic rubber.

12. The apparatus according to claim 9 wherein the printing stamp is made of polydimethylsiloxane (PDMS).

13. The apparatus according to claim 9 wherein the printing stamp is made of a polyolefin.

14. The apparatus according to claim 1 wherein the positioning mechanism is constructed and configured for being moved into position for stamping micro patterns onto multiple substrate surfaces.

15. The apparatus according to claim 1 wherein the rigid support member is made of a plastic.

16. The apparatus according to claim 1 wherein the rigid support member is a tube.

17. The apparatus according to claim 1 wherein the one or more materials on the outer surface are analyte-specific receptors to which pre-selected analyte species bind.

18. The apparatus according to claim 1 wherein said positioning mechanism is configured to move the flexible portion of the diaphragm to a distance from the substrate surface in a range between about 0.0005 to about 0.005 inches.

* * * * *